United States Patent
Grudowski et al.

(10) Patent No.: US 8,021,957 B2
(45) Date of Patent: Sep. 20, 2011

(54) PROCESS OF FORMING AN ELECTRONIC DEVICE INCLUDING INSULATING LAYERS HAVING DIFFERENT STRAINS

(75) Inventors: Paul A. Grudowski, Austin, TX (US); Venkat R. Kolagunta, Austin, TX (US); Mehul D. Shroff, Austin, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 0 days.

(21) Appl. No.: 12/883,096

(22) Filed: Sep. 15, 2010

(65) Prior Publication Data

US 2011/0003444 A1    Jan. 6, 2011

Related U.S. Application Data

(62) Division of application No. 11/669,794, filed on Jan. 31, 2007, now Pat. No. 7,843,011.

(51) Int. Cl.
*H01L 21/76* (2006.01)
(52) U.S. Cl. ................... 438/424; 257/E21.546
(58) Field of Classification Search .............. None
See application file for complete search history.

(56) References Cited

U.S. PATENT DOCUMENTS

| | | | |
|---|---|---|---|
| 4,569,698 A | 2/1986 | Feist | |
| 4,667,395 A | 5/1987 | Ahlgren et al. | |
| 5,200,351 A | 4/1993 | Hadjizadeh-Amini | |
| 5,283,202 A | 2/1994 | Pike, Jr. et al. | |
| 5,849,616 A | 12/1998 | Ogoh | |
| 5,970,330 A | 10/1999 | Buynoski | |
| 6,506,642 B1 | 1/2003 | Luning et al. | |
| 6,686,286 B2 | 2/2004 | Yoon | |
| 6,815,279 B2 | 11/2004 | Yagishita | |
| 6,864,135 B2 | 3/2005 | Grudowski et al. | |
| 6,870,179 B2 | 3/2005 | Shaheed et al. | |
| 6,872,617 B2 | 3/2005 | Sashida | |
| 6,876,081 B2 | 4/2005 | Chow | |
| 6,902,971 B2 | 6/2005 | Grudowski | |

(Continued)

FOREIGN PATENT DOCUMENTS

EP    1487007 A2    12/2004

(Continued)

OTHER PUBLICATIONS

Grudowski, P. et al. "1-D and 2-D Geometry Effects in Uniaxially-Strained Dual Etch Stop Layer Stressor Integrations"; 2006 Symposium on VLSI Technology, Digest of Technical Papers; 2006; pp. 62-63; IEEE ISBN 1-4244-0005-8.

(Continued)

*Primary Examiner* — Ha Tran T Nguyen
*Assistant Examiner* — Kevin Quinto

(57) ABSTRACT

An electronic device can include a field isolation region and a first insulating layer having a first strain and having a portion, which from a top view, lies entirely within the field isolation region. The electronic device can also include a second insulating layer having a second strain different from the first strain and including an opening. From a top view, the portion of the first insulating layer can lie within the opening in the second insulating layer. In one embodiment, the field isolation region can include a dummy structure and the portion of the first insulating layer can overlie the dummy structure. A process of forming the electronic device can include forming an island portion of an insulating layer wherein from a top view, the island portion lies entirely within the field isolation region.

20 Claims, 6 Drawing Sheets

U.S. PATENT DOCUMENTS

| | | | |
|---|---|---|---|
| 6,929,965 | B2 | 8/2005 | Chen et al. |
| 6,933,565 | B2 | 8/2005 | Matsumoto et al. |
| 6,982,465 | B2 | 1/2006 | Kumagai et al. |
| 7,084,061 | B2 | 8/2006 | Sun et al. |
| 7,101,742 | B2 | 9/2006 | Ko et al. |
| 7,105,394 | B2 | 9/2006 | Hachimine et al. |
| 7,109,568 | B2 | 9/2006 | Kumagai et al. |
| 7,138,310 | B2 | 11/2006 | Currie et al. |
| 7,163,903 | B2 | 1/2007 | Orlowski et al. |
| 7,190,036 | B2 | 3/2007 | Ko et al. |
| 7,276,769 | B2 | 10/2007 | Yamada et al. |
| 7,279,746 | B2 | 10/2007 | Doris et al. |
| 7,297,584 | B2 | 11/2007 | Park et al. |
| 7,316,960 | B2 | 1/2008 | Ting |
| 7,374,987 | B2 | 5/2008 | Chidambarrao et al. |
| 7,420,202 | B2 | 9/2008 | Adams et al. |
| 7,423,330 | B2 | 9/2008 | Satoh |
| 7,442,598 | B2 | 10/2008 | Grudowski et al. |
| 7,445,978 | B2 | 11/2008 | Teh et al. |
| 7,462,526 | B2 | 12/2008 | Henley |
| 7,488,670 | B2 | 2/2009 | Knoefler et al. |
| 7,504,289 | B2 | 3/2009 | Lim et al. |
| 7,511,360 | B2 | 3/2009 | Shroff et al. |
| 7,714,318 | B2 | 5/2010 | Adams et al. |
| 2002/0135071 | A1* | 9/2002 | Kang et al. .................... 257/767 |
| 2005/0029601 | A1 | 2/2005 | Chen et al. |
| 2005/0040461 | A1 | 2/2005 | Ono et al. |

FOREIGN PATENT DOCUMENTS

| | | |
|---|---|---|
| KR | 100567022 B1 | 4/2006 |
| KR | 20060034686 A | 4/2006 |
| KR | 20070011408 A | 1/2007 |
| WO | 2004049406 A1 | 6/2004 |
| WO | 2004114400 A1 | 12/2004 |
| WO | 2005098962 A1 | 10/2005 |

OTHER PUBLICATIONS

Pidin, S. et al. "A Novel Strain Enhanced CMOS Architecture Using Selectively Deposited High Tensile and High Compressive Silicon Nitride Films"; 2004 Electron Devices Meeting, IEDM Technical Digest International; Dec. 13-15, 2004; pp. 213-216; IEEE ISBN 0-7803-8684-1.

Shimizu, A. et al. "Local Mechanical-Stress Control (LMC): A New Technique for CMOS-Performance Enhancement"; 2001 Electron Devices Meeting, IEDM Technical Digest International; Dec. 2-5, 2001; pp. 19.4.1-19.4.4; IEEE ISBN 0-7803-7050-3.

Yang, H.S. et al. "Dual Stress Liner for High Performance sub-45nm Gate Length SOI CMOS Manufacturing"; 2004 Electron Devices Meeting, IEDM Technical Digest International; Dec. 13-15, 2004; pp. 1075-1077; IEEE ISBN 0-7803-8684-1.

EPC Application No. 06816682.6; Extended Search Report mailed Oct. 7, 2009.

PCT Search Report and Written Opinion for PCT Application No. PCT/US2008/050969 mailed Jun. 24, 2008.

* cited by examiner

PROCESS OF FORMING AN ELECTRONIC DEVICE INCLUDING INSULATING LAYERS HAVING DIFFERENT STRAINS

CROSS-REFERENCE TO RELATED APPLICATIONS

This is a divisional application of and claims priority under 35 U.S.C. §120 to U.S. patent application Ser. No. 11/669,794 entitled "Electronic Device Including Insulating Layers Having Different Strains and a Process for Forming the Electronic Device," by Grudowski, filed Jan. 31, 2007, which is assigned to the current assignee hereof and incorporated herein by reference in its entirety.

BACKGROUND

1. Field of the Disclosure

The present disclosure relates to electronic devices, more particularly, to electronic devices that include insulating layers having different strains and process for forming them.

2. Description of the Related Art

Semiconductor-on-insulator ("SOI") architectures are becoming more common as electronic and device performance requirements continue to be more demanding. Carrier mobility within the channel regions of the n-channel and p-channel transistors is an area for continued improvement. Many approaches use a dual stressor layer before forming a premetal dielectric ("PMD") layer. The dual stressor layer can be incorporated into an electronic device as an etch-stop layer before forming the PMD layer. For the dual stressor layer, the etch-stop layer includes a tensile layer over n-channel transistor structures and a compressive layer over the p-channel transistor structures.

Some of the attempts have focused on changing the stress within the active region along the channel length direction of the transistor structure to affect drain current and transconductance of the transistor.

BRIEF DESCRIPTION OF THE DRAWINGS

The present disclosure may be better understood, and its numerous features and advantages made apparent to those skilled in the art by referencing the accompanying drawings. The subject of the disclosure is illustrated by way of example and not limitation in the accompanying figures.

Figure 1:
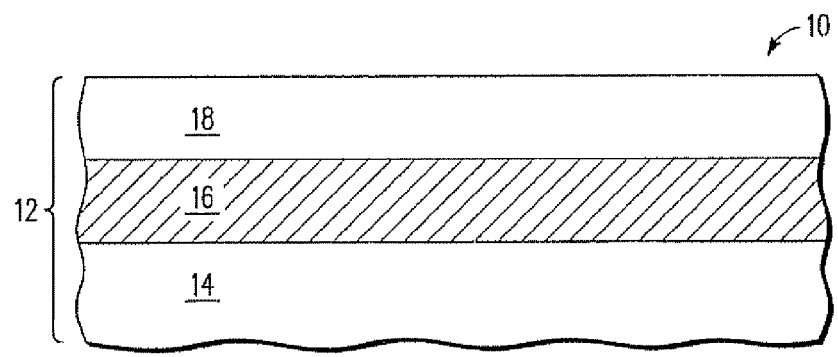
FIG. 1 includes an illustration of a cross-sectional view of a workpiece including a substrate 12.

Skilled artisans appreciate that elements in the figures are illustrated for simplicity and clarity and have not necessarily been drawn to scale. For example, the dimensions of some of the elements in the figures may be exaggerated relative to other elements to help to improve understanding of embodiments of the invention. The use of the same reference symbols in different drawings indicates similar or identical items.

DETAILED DESCRIPTION

In a first aspect, an electronic device can include a field isolation region. The electronic device can also include a first insulating layer having a first strain and including a first portion overlying the field isolation region, wherein, from a top view, the first portion lies entirely within the field isolation region. The electronic device can further include a second insulating layer having a second strain different from the first strain and including an opening wherein, from a top view, the first portion of the first insulating layer lies within the opening in the second insulating layer.

In a second aspect, an electronic device can include a substrate and an active region. The electronic device can also include a field isolation region overlying the substrate and adjacent to the active region, wherein the field isolation region includes a first dummy structure including a first portion of the substrate, and a second dummy structure including a second portion of the substrate. The electronic device can further include a first insulating layer overlying the first dummy structure and not the second dummy structure, wherein the first insulating layer has a first strain. The electronic device can still further include a second insulating layer overlying the second dummy structure and not the first dummy structure, wherein the second insulating layer has a second strain different from the first strain. Also, from a top view, the first insulating layer lies within an opening in the second insulating layer, and substantially none of the active region lies within the opening.

In a third aspect, a process of forming an electronic device can include forming a field isolation region within a substrate. The process can also include forming a first insulating layer over the field isolation region and having a first strain, wherein from a top view, an island portion of the first insulating layer lies entirely within the field isolation region. The process can further include forming a second insulating layer over the field isolation region, having a second strain different from the first strain, and including a first opening, wherein from a top view, the island portion of the first insulating layer lies within the first opening in the second insulating layer.

An electronic device is formed having a composite layer formed from a first insulating layer and a second insulating layer, each having a different strain. In accordance with a specific embodiment, a portion of a tensile layer lying at least 2 microns from a p-channel region can be removed without significantly affecting the carrier mobility enhancements caused by the stress within the p-channel region. In a particular embodiment, from a top view, a compressive layer having substantially the same material composition as the tensile layer can lie within the opening in the tensile layer and form the composite layer, and the composite layer can be substantially continuous. As a result, the composite layer can be used as an etch stop layer in a subsequent etch process. By forming the composite layer in such a manner, the area to be etched can be adjusted to improve the end point signal produced during the etch process leading to reduced process variation without substantially changing the strain induced within the channel region of the electronic device. Specific embodiments of the present disclosure will be better understood with reference to FIGS. 1 through 10.

Some terms are defined or clarified as to their intended meaning as they are used within this specification.

The term "channel length" is intended to mean a dimension of a channel region of a transistor, wherein the dimension represents a minimum distance between a source region and a drain region or between source/drain regions of the transistor. From a top view, the channel length is typically in a direction that is substantially perpendicular to channel-source region interface, channel-drain region interface, channel-source/drain region interface, or the like.

The term "channel width" is intended to mean a dimension of a channel region of a transistor, wherein the dimension is measured in a direction substantially perpendicular to the channel length. From a top view, the channel width is the distance within the channel region between one channel region-field isolation region interface to an opposite channel region-field isolation region interface.

The term "dummy structure" is intended to mean a structure that includes a portion of a layer used to form an active region that does not include an electrically active portion of a semiconductor component. For example, a tile within the field isolation region used to help control dishing during a polishing process is a dummy structure.

The term "lateral stress" is intended to mean a horizontally applied stress within an active region in a direction substantially parallel to a channel length of a transistor.

The term "semiconductor substrate" is intended to mean a substrate having a semiconductor layer on which an electronic device can be formed. A semiconductor substrate can include a buried insulating layer. Examples of semiconductor substrates include bulk silicon wafers, a silicon on sapphire substrate, semiconductor-on-insulator wafers, or the like.

The term "strain" is intended to mean a deformation of a body in reaction to a force applied at a boundary of the body. A strain can be compressive or tensile. A body with zero strain is unstrained. For example, a first material with a first atomic spacing in contact with a second material with a second atomic spacing different from the first atomic spacing can cause deformation, and therefore strain in both layers.

The term "stress" is intended to mean a reactive force per area within a body to balance an externally applied force. Stress can be compressive, zero, or tensile. For example, a first material with a first atomic spacing in contact with a second material with a second atomic spacing different from the first atomic spacing can exert a stress on the second material.

The term "transverse stress" is intended to mean a horizontally applied stress within an active region in a direction substantially perpendicular to the channel length.

The term "unit of misalignment tolerance" is intended to mean the maximum amount of allowable misalignment at a particular masking level. For example, if a mask can be misaligned +/−10 nm, the unit of misalignment tolerance is 20 nm. The maximum amount of allowable misalignment may be determined in part by the design rules, minimum feature size at the particular masking level, minimum pitch at the particular masking level, or any combination thereof.

The term "vertical stress" is intended to mean a stress applied in a direction perpendicular to a major surface of a substrate.

As used herein, the terms "comprises," "comprising," "includes," "including," "has," "having" or any other variation thereof, are intended to cover a non-exclusive inclusion. For example, a process, method, article, or apparatus that comprises a list of elements is not necessarily limited to only those elements but may include other elements not expressly listed or inherent to such process, method, article, or apparatus. Further, unless expressly stated to the contrary, "or" refers to an inclusive or and not to an exclusive or. For example, a condition A or B is satisfied by any one of the following: A is true (or present) and B is false (or not present), A is false (or not present) and B is true (or present), and both A and B are true (or present).

Additionally, for clarity purposes and to give a general sense of the scope of the embodiments described herein, the use of the "a" or "an" are employed to describe one or more articles to which "a" or "an" refers. Therefore, the description should be read to include one or at least one whenever "a" or "an" is used, and the singular also includes the plural unless it is clear that the contrary is meant otherwise.

Unless otherwise defined, all technical and scientific terms used herein have the same meaning as commonly understood by one of ordinary skill in the art to which this invention belongs. All publications, patent applications, patents, and other references mentioned herein are incorporated by reference in their entirety. In case of conflict, the present specification, including definitions, will control. In addition, the materials, methods, and examples are illustrative only and not intended to be limiting.

To the extent not described herein, many details regarding specific materials, processing acts, and circuits are conventional and may be found in textbooks and other sources within the semiconductor and microelectronic arts. Other features and advantages of the invention will be apparent from the following detailed description, and from the claims.

FIG. 1 includes an illustration of a cross-sectional view of a portion of a workpiece 10 including a portion of a semiconductor substrate 12. In the illustrated embodiment, the semiconductor substrate 12 is a semiconductor-on-insulator ("SOI") substrate that includes a base layer 14, an insulating layer 16, and a semiconductor layer 18. Although illustrated as SOI substrate, in another embodiment, the semiconductor substrate 12 includes a different type of semiconductor substrate.

In the illustrated embodiment, the base layer 14 includes a support layer and provides mechanical support for the other layers of the substrate 12. The base layer 14 includes substantially any material physically strong enough to support the substrate 12 and compatible with the subsequent processing. In a particular embodiment, the base layer 14 includes a semiconductor material. The insulating layer 16 is a buried insulating layer and provides electrical insulation between the base layer 14 and the semiconductor layer 18. The insulating layer 16 can include an oxide, a nitride, an oxynitride, or any combination thereof The semiconductor layer 18 includes a semiconductor material such as silicon, germanium, carbon, or any combination thereof, and has a substantially uniform thickness in a range of approximately 25 to approximately 150 nm. The semiconductor layer 18 includes an n-type dopant, a p-type dopant, or any combination thereof.

Figure 2:
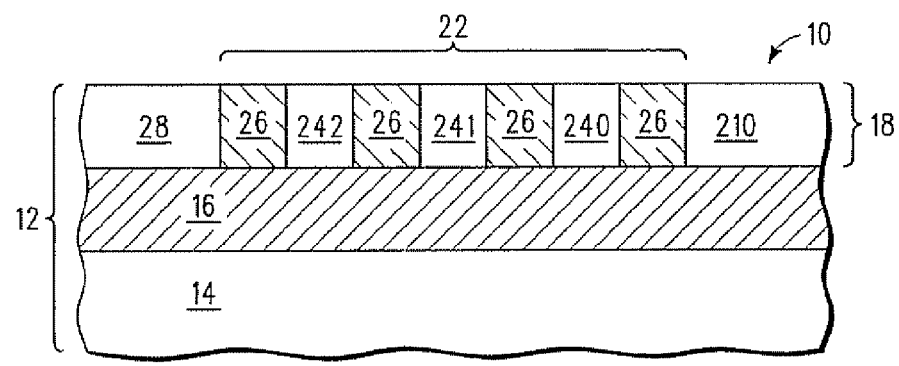
FIG. 2 includes an illustration of a cross-sectional view of the workpiece of FIG. 1 after forming a field isolation region including an insulating region and dummy structures.

FIG. 2 includes an illustration of a cross-sectional view of the workpiece 10 after forming a field isolation region 22 lying between an active region 28 and an active region 210 of the semiconductor layer 18. The active region 28 and the active region 210 each include a portion of the semiconductor layer 18. The active region 28 and active region 210 each includes a dopant appropriate for forming an n-channel transistor, a p-channel transistor, or any combination thereof. As compared to each other the active regions 28 and 210 have the same or different dopant type and are formed by the same or different process. In the illustrated embodiment, the active region 28 includes material appropriate for forming a p-channel transistor and the active region 210 includes material appropriate for forming an n-channel transistor. The active region 28 and the active region 210 are formed using a conventional or proprietary process.

The field isolation region 22 provides electrical insulation between the active region 28 and the active region 210. In the illustrated embodiment, the field isolation region 22 includes a dummy structure 240, a dummy structure 241, a dummy structure 242, and an insulating region 26. The dummy structures 240, 241, and 242 are electrically insulated from one another and the active regions 28 and 210. The dummy structures 240, 241, and 242 help reduce process variation during subsequent processing. The dummy structures 242 lies closer to the active region 28 than the dummy structure 240 or the dummy structure 241. In one embodiment, the dummy structure 242 lies not more than approximately 2 microns from the active region 28. In another embodiment, the dummy structure 242 lies not more than approximately 1 micron from the active region 28. The dummy structure 240, the dummy structure 241, and the dummy structure 242 include portions of the semiconductor layer 18 remaining after forming the insulating region 26. The insulating region 26 includes an electrically insulating material such as an oxide, a nitride, an oxynitride, or any combination thereof.

In a particular embodiment of forming the field isolation region 22, a patterned protective layer (not illustrated) is formed over the semiconductor layer 18 leaving a portion exposed within the field isolation region 22. In one embodiment, the exposed portions of the semiconductor layer 18 are removed and replaced with an insulating material using conventional or proprietary etch and deposition processes to form the insulating region 26. In another embodiment, the exposed portions of the semiconductor layer 18 are oxidized using a conventional or proprietary process to form the insulating region 26. Although not illustrated, in another embodiment, the field isolation region 22 can include a mesa isolation scheme, wherein the exposed material is removed from the insulating region 26 as previously described but is not replaced, and in still another embodiment, the field isolation region 22 does not include any dummy structure such as the dummy structure 240, the dummy structure 241, or the dummy structure 242.

Figure 3:
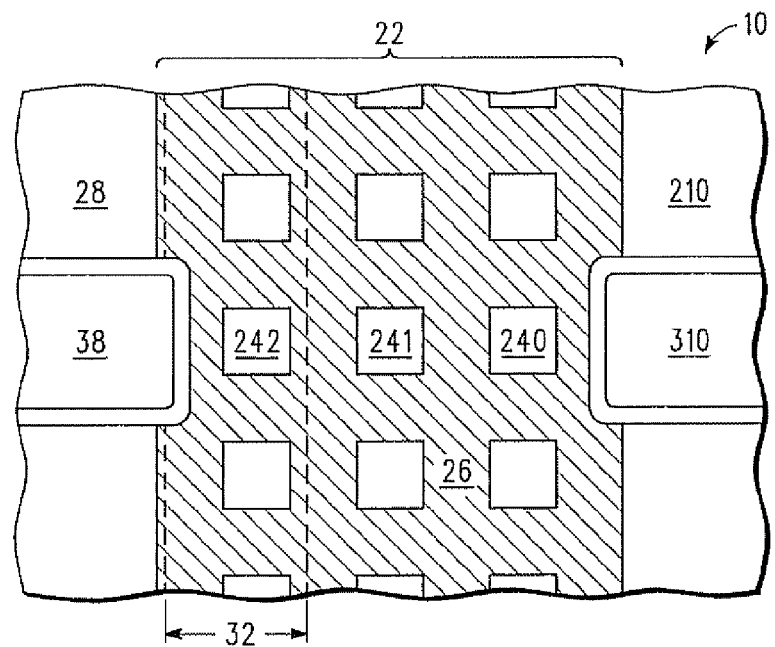
FIG. 3 includes an illustration of a top-view of the workpiece of FIG. 2 including an exclusion region after forming a gate electrode structure.

FIG. 3 includes an illustration of a top view of the workpiece of FIG. 2 after forming a gate electrode structure 38 over the active region 28 and a gate electrode structure 310 over the active region 210. The gate electrode structure 38 and the gate electrode structure 310 include a gate dielectric layer (not illustrated), a conductive layer, and a sidewall spacer. Each of the gate electrode structure 38 and the gate electrode structure 310 acts as a portion of an n-channel transistor or a p-channel transistor. Each portion of the gate electrode structure 38 and the gate electrode structure 310 can be formed of the same or different material, at the same or different time, using the same or different conventional or proprietary deposition or etch process. In one embodiment, the gate electrode structure 38 includes a gate electrode for a p-channel transistor. In another embodiment, the gate electrode structure 310 includes a gate electrode for an n-channel transistor.

An exclusion region 32 is also illustrated in FIG. 3. The exclusion region 32 includes a portion of the field isolation region 22 in a range of approximately 1 unit of misalignment tolerance from the active region 28 to a distance from the active region 28 greater than 1 unit of misalignment tolerance. In one embodiment, the distance is approximately 2 microns. In another embodiment, the distance is approximately 1 micron. In the illustrated embodiment, the dummy structure 242 lies within the exclusion region 32, and the dummy structure 240 and the dummy structure 241 lie outside of the exclusion region 32.

Figure 4:
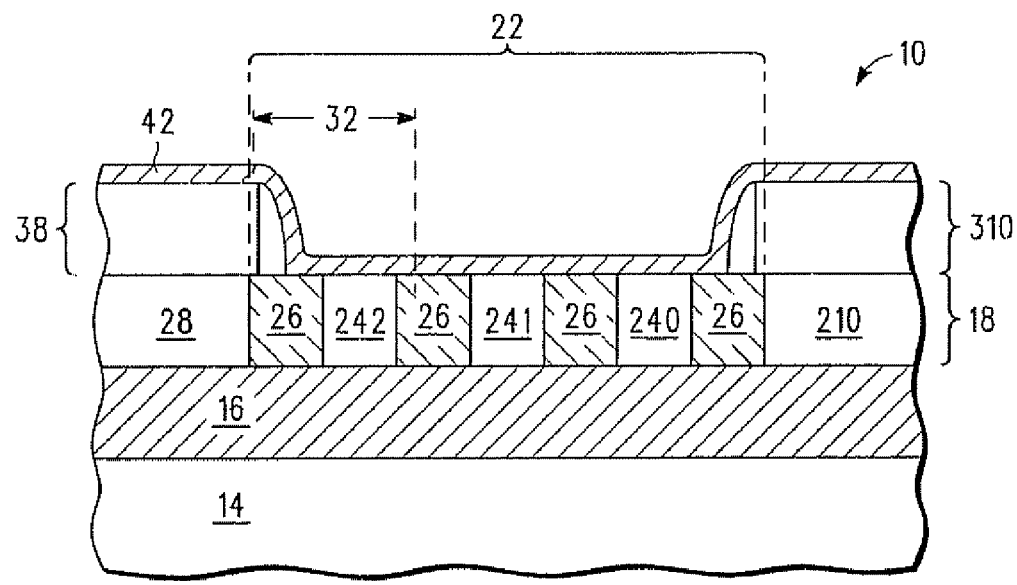
FIG. 4 includes an illustration of a cross-sectional view of the workpiece of FIG. 3 after forming a first insulating layer.

FIG. 4 includes an illustration of a cross-sectional view of the workpiece 10 of FIG. 3 after forming an insulating layer 42. The insulating layer 42 can serve as an etch stop layer for a subsequently performed etch process. The insulating layer 42 includes an oxide, a nitride, an oxynitride, or any combination thereof. The insulating layer 42 is deposited using a chemical vapor deposition ("CVD") process, a physical vapor deposition ("PVD") process, an atomic layer deposition ("ALD") process, or any combination thereof.

In one embodiment, insulating layer 42 has a compressive strain. In a particular embodiment, insulating layer 42 has a compressive strain of not less than approximately 1.0 GPa. In an even more specific embodiment, insulating layer 42 has a compressive strain in a range of approximately 1.5 to approximately 3.5 GPa. In another embodiment, insulating layer 42 is not greater than approximately 200 nm in thickness, and in a particular embodiment, is not greater than approximately 90 nm in thickness. In a more particular embodiment, insulating layer 42 is in a range of approximately 40 nm to approximately 90 nm.

A masking layer (not illustrated) is formed over the insulating layer 42 to protect a portion of the insulating layer 42 as part of a patterning process. In a particular embodiment, the masking layer protects a portion of the insulating layer 42 overlying the field isolation region 22 that does not overlie an active portion of the semiconductor layer 18. The patterning process is performed using a conventional or proprietary lithographic process, etch process, mask removal process, or any combination thereof.

Figure 5:
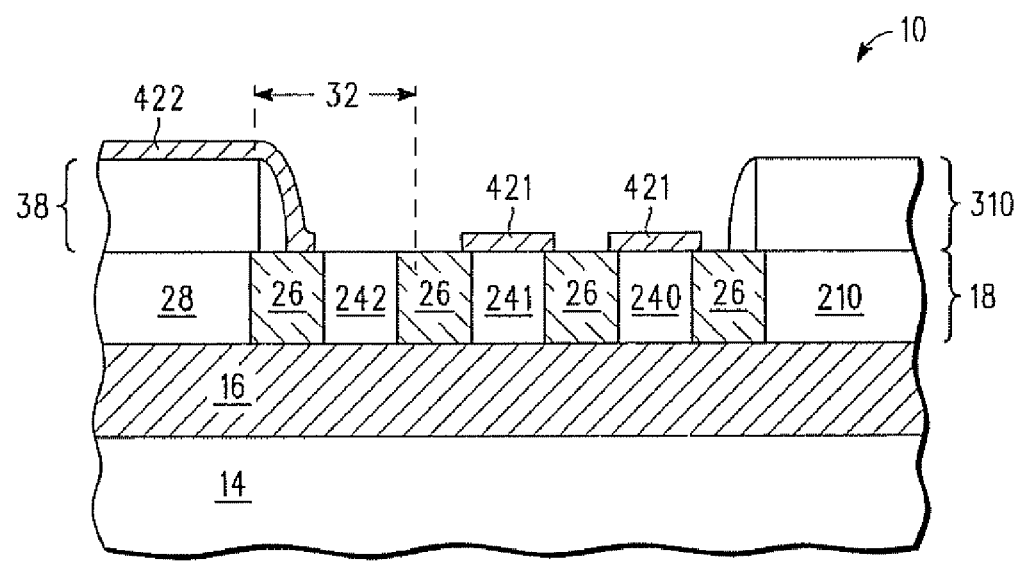
FIG. 5 includes an illustration of a cross-sectional view of the workpiece of FIG. 4 after patterning the first insulating layer.

FIG. 5 includes an illustration of a cross-sectional view of the workpiece 10 of FIG. 4 after patterning the insulating layer 42. The insulating layer 42 includes first portions 421 overlying the field isolation region 22 and a second portion 422 overlying the active region 28 and the gate electrode 38. In a particular embodiment, the first portions 421 lie outside of the exclusion zone 32. In a more particular embodiment, a shortest distance from one of the first portions 421 to the second portion 422 of the insulating layer 42 is at least approximately 1 micron and in another more particular embodiment, is at least approximately 2 microns. In still another particular embodiment, the first portions 421 overlie the dummy structure 241, the dummy structure 240, or any combination thereof.

Figure 6:
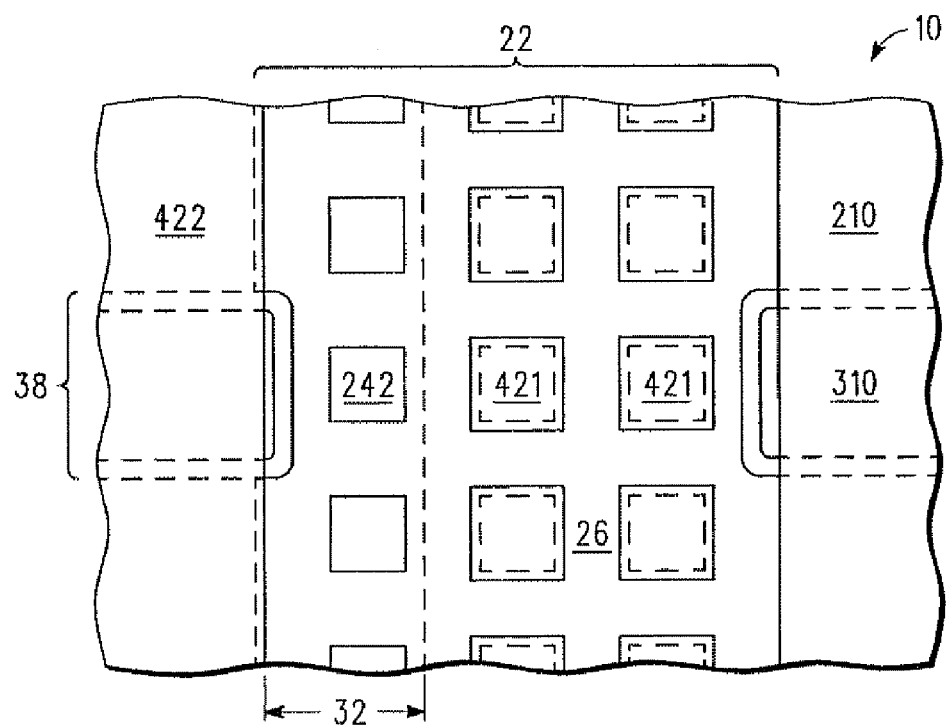
FIG. 6 includes an illustration of a top-view of the workpiece of FIG. 5.

FIG. 6 includes an illustration of a top view of the workpiece 10 of FIG. 5. In the illustrated embodiment, the first portions 421 and the second portion 422 of the insulating layer 42 have edges that overlie the insulating region 26. In a particular embodiment, the first portions 421 include a first edge that, from a top view, lies within the insulating region 26 of the field isolation region 22. In another particular embodiment, the first portions 421 include an island portion of the insulating layer 42, and from a top view, the first portions 421 lie entirely within the field isolation region 22. As illustrated in FIGS. 5 and 6, the second portion 422 includes an edge that overlies the insulating region 26 near an edge of the active region 28 parallel to the gate length direction. In one embodiment, the edge of the second portion 422 and the edge of the active region 28 are substantially parallel to each other, and from a top view, separated by at least approximately 1 unit of misalignment tolerance. In another particular embodiment, from a top view, the first portions 421 and the second portion 422 cover cumulatively greater than approximately 25% of the area of the workpiece 10 when the second portion 422 covers less than approximately 10% of the area of the workpiece 10.

Figure 7:
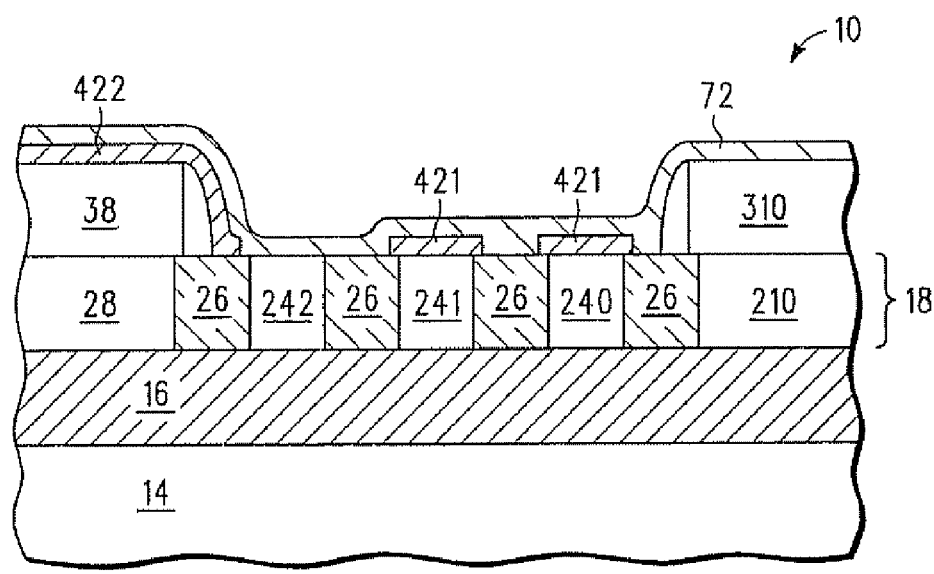
FIG. 7 includes an illustration of a cross-sectional view of the workpiece of FIGS. 5 and 6 after forming a second insulating layer.

FIG. 7 includes an illustration of a cross-sectional view of the workpiece of FIGS. 5 and 6 after forming an insulating layer 72 over the first portions 421 and the second portion 422 of the insulating layer 42. The insulating layer 72 serves as an etch stop layer for a subsequently performed etch process. The insulating layer 72 includes a material and is formed using an embodiment previously described with respect to the insulating layer 42. The insulating layer 72 has a different strain than the insulating layer 42.

In the illustrated embodiment, the insulating layer 72 has a tensile strain. In one embodiment, insulating layer 72 is more tensile than insulating layer 42. In a particular embodiment, insulating layer 72 has a tensile strain not less than approximately 0.6 GPa in magnitude. In an even more particular embodiment, insulating layer 72 has a tensile strain in a range of approximately 1.0 to approximately 2.0 GPa in magnitude. Insulating layer 72 has a thickness in a range as previously described for insulating layer 42. In one embodiment, insulating layer 72 has substantially the same thickness as insulating layer 42. In another embodiment, insulating layer 72 has substantially the same chemical composition as insulating layer 42. In a particular embodiment, insulating layer 72 is formed using a different set of precursor materials from the insulating layer 42, and in another particular embodiment, the insulating layer 72 is formed using the same set of precursor materials as the insulating layer 42. In still another particular embodiment, the insulating layer 72 and the insulating layer 42 are formed using different radio frequency ("RF") powers, different RF frequencies, different precursor gases, different precursor gas flow rates, or any combination thereof which allows the different strains of the insulating layer 42 and the insulating layer 72 to be achieved. Although not illustrated, in still another particular embodiment the insulating layer 72, the insulating layer 42, or any combination thereof has a first strain immediately after deposition and has a second strain different from the first strain after a subsequent treatment. In a more particular embodiment the insulating layer 42, the insulating layer 72 or any combination thereof is exposed to a laser source.

A masking layer (not illustrated) is formed over the insulating layer 72 and serves to protect a portion of the insulating layer 72 as part of a patterning processing. In one embodiment, substantially all of the insulating layer 72 overlying remaining portions of the insulating layer 42 are exposed within an opening in the masking layer. In another embodiment, from a top view, the masking layer covers substantially all of the opening in the insulating layer 42. The patterning process is performed using a conventional or proprietary lithographic process, etch process, mask removal process, or any combination thereof.

Figure 8:
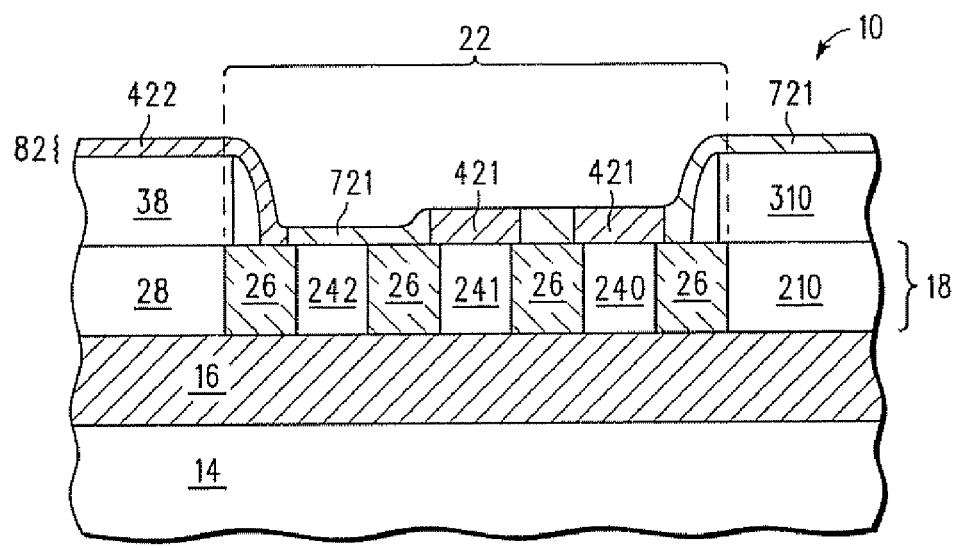
FIG. 8 includes an illustration of a cross-sectional view of the workpiece of FIG. 7 after patterning the second insulating layer.
Figure 9:
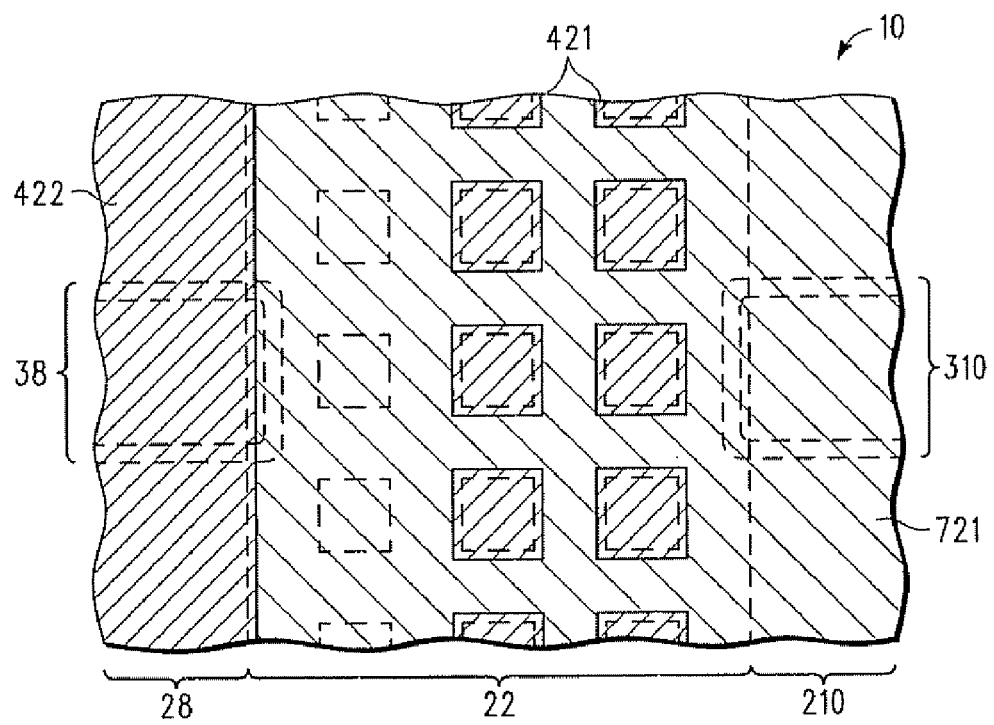
FIG. 9 includes an illustration of a top-view of the workpiece of FIG. 8.

FIGS. 8 and 9 include an illustration of a cross-sectional view and a top view, respectively, of the workpiece 10 of FIG. 7 after patterning the insulating layer 72 to form a third portion 721. The third portion 721 overlies the active region 210 including the transistor structure 310 and portions of the field isolation region 22 including the dummy structure 242. In the embodiment illustrated in FIG. 8, a composite layer 82 includes the first portions 421, the second portion 422, and the third portion 721. The composite layer 82 is substantially continuous over the workpiece 10 and acts as an etch stop layer in a subsequently performed etch process. A remaining portion of the insulating layer 42 includes the first portions 421 and the second portion 422 and has a first strain. The remaining portion of the insulating layer 72 includes the third portion 721 and has a second strain different from the first strain. In a particular embodiment, first portions 421 and second portion 422 have a compressive strain, and third portion 721 has a tensile strain.

In the embodiment illustrated in FIG. 9, each of the first portions 421 and the second portion 422 lie within an opening formed in the insulating layer 72, and each of the openings has an edge overlying the insulating region 26. In a particular embodiment, the third portion 721 includes an edge overlying the field isolation region 22 that is substantially parallel to the edge of the first portions 421 and the second portion 422. Although not illustrated, the edges of the first portions 421 and the second portion 422 can overlap or under lap with the edges of the third portion 721.

Still referring to the illustration in FIG. 9, the area of the composite layer 84 is substantially equal to the area of the remaining portions of the insulating layer 42 and the area of the insulating layer 72. In one embodiment, a quotient of the cumulative area of the remaining portions of the insulating layer 42 divided by the area of the remaining portion of the insulating layer 72 is greater than approximately 0.2. In a particular embodiment, the quotient is greater than approximately 0.3, and in a more particular embodiment, the quotient is greater than 0.35.

Figure 10:
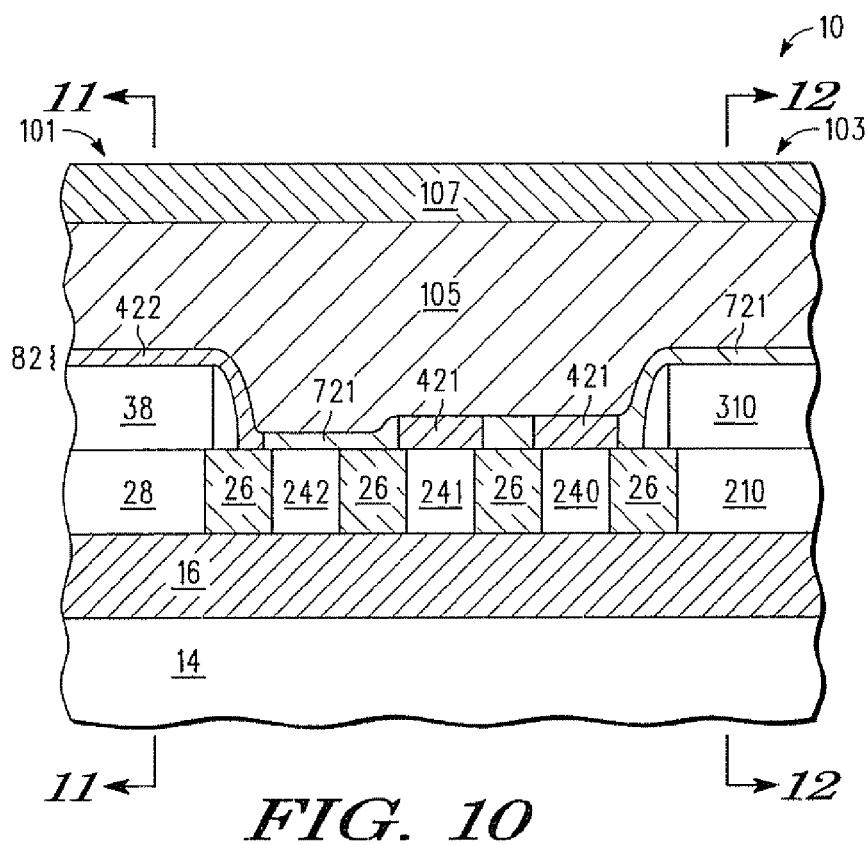
FIG. 10 includes an illustration of a cross sectional view of a substantially complete electronic device including a first transistor and a second transistor.

FIG. 10 includes an illustration of a cross-sectional view of the substantially complete electronic device and includes an insulating layer 105 and encapsulating layer 107. The illustration also includes a transistor 101 including the gate electrode structure 38, and a transistor 103 including the gate electrode structure 310. The insulating layer 105 insulates portions of an interconnect layer (not illustrated in FIG. 10) from each other and includes an insulating material as previously described for the insulating layer 42. In one embodiment, the insulating layer 105 includes a different insulating material than the composite layer 82 such that the material of insulating layer 105 can be etched selectively with respect to the composite layer 82.

Figure 11:
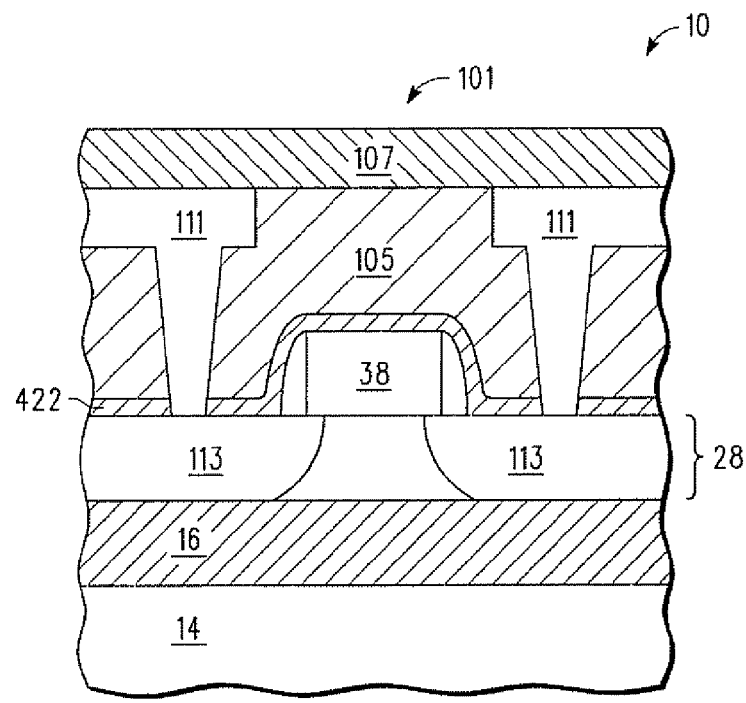
FIG. 11 includes an illustration of another cross-sectional view of the electronic device of FIG. 10 perpendicular to the view in FIG. 10 through the first transistor along sectioning line 11-11 of FIG. 10.
Figure 12:
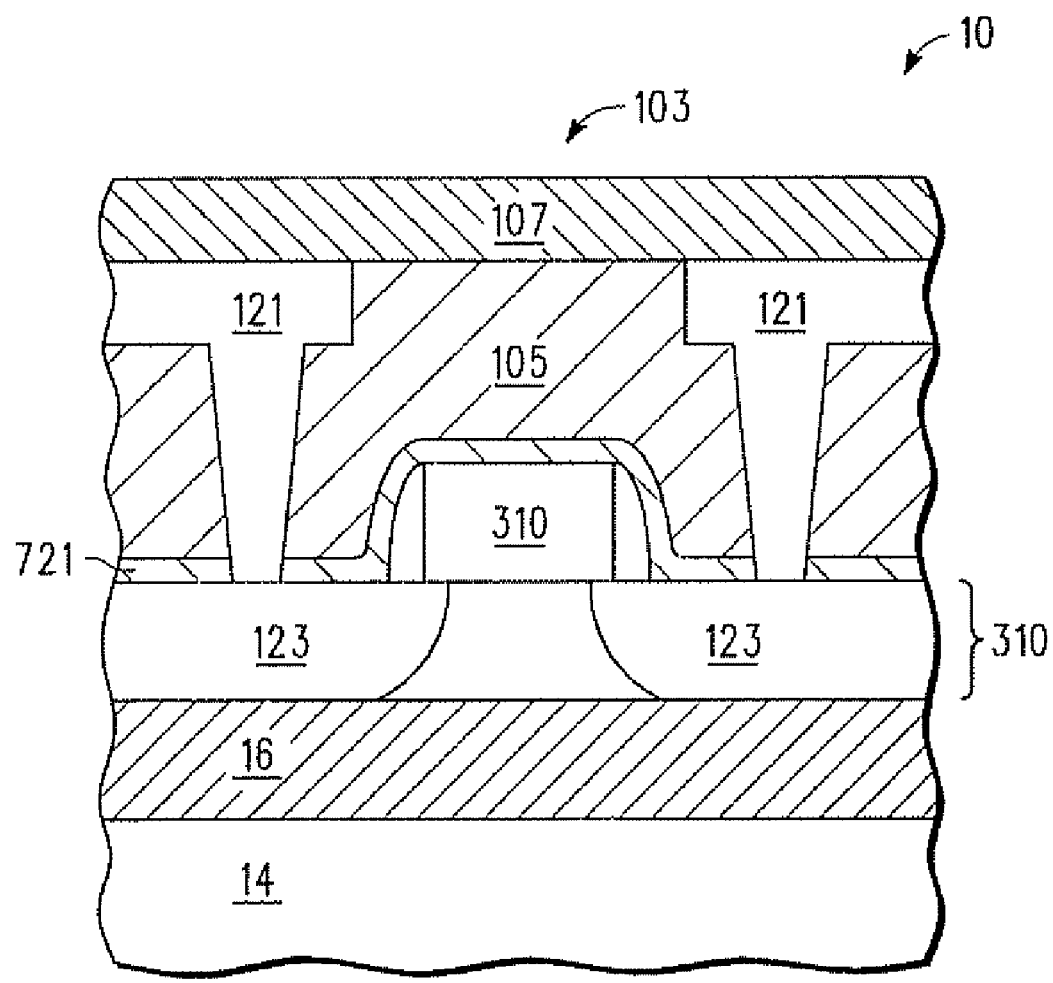
FIG. 12 includes an illustration of another cross-sectional view of the electronic device of FIG. 10 perpendicular to the view in FIG. 10 through the second transistor along sectioning line 12-12 of FIG. 10.

FIG. 11 and FIG. 12 include an illustration of a cross-sectional view of the workpiece 10 perpendicular to the view in FIG. 10 through the transistor 101 and the transistor 103, respectively. FIG. 11 includes interconnect layer 111 electrically connecting to doped regions 113. FIG. 12 includes an interconnect layer 121 electrically connecting to the doped regions 123. For clarity, the FIGS. 11 and 12 will be described in parallel. In the illustrated embodiment, after depositing the insulating layer 105 a patterned layer (not illustrated) is formed including an opening over the doped regions 113 and the doped regions 123. The insulating layer 105 is etched, stopping on the composite layer 82. As illustrated, the etch process exposes portions of the second portion 422 of the composite layer 82 over the doped regions 113 and the third portion 721 of the composite layer 82 over the doped regions 123. The portions of the composite layer 82 exposed within the openings are then etched to complete contact openings over the both the doped region 113 and the doped region 123.

Although the second portion 422 and the third portion 721 have different strains, they can etch substantially the same under the same set of etch conditions.

An interconnect layer 111 and an interconnect layer 121 are then formed each including a contact within the corresponding contact opening. In a particular embodiment, the transistor 101 includes a p-channel transistor, and the transistor 103 includes an n-channel transistor. The interconnect layer 111 and the interconnect layer 121 lie within the insulating layer 105 and include a conductive material typically used in semiconductor manufacturing. In the illustrated embodiment, the interconnect layer 111 and the interconnect layer 121 are formed at substantially the same time, of substantially the same material, using substantially the same deposition and removal processes.

The encapsulating layer 107 helps protect the semiconductor device from performance decay due to atmospheric exposure and is formed using a conventional or proprietary deposition process. In one embodiment, the encapsulating layer includes a nitride, an oxynitride, or any combination thereof. Openings are formed in the encapsulating layer so that electrical connection can be made to the electronic device. Although not illustrated, the electronic device can include an additional interconnect layer, dielectric layer, encapsulating layer, or any combination thereof.

Thus a composite layer 82 applies different stresses in a complementary fashion to the channel regions of an electronic device. By including first portions 421 over the field isolation region 22 and set apart from the second portion 422 over an active region, pattern dependent loading effects can be addressed to improve process control during removal of portions of the insulating layer 42, the insulating layer 72, or any combination thereof. By forming an exclusion region 32 between the first portions 421 and the second portions 422, there can be a substantially the same amount of complementary strain in the channel region as when the area covered by the first portions 421 is covered by third portion 721. Improved consistency in etch process control can improve end point detection leading to more consistent parametric results for a finished electronic device.

Other processes of forming the composite layer 82 are possible. In an alternative embodiment, the insulating layer 42 includes a tensile strain and the insulating layer 72 includes a compressive strain. In another alternative embodiment, the order of forming the remaining portions of the insulating layer 42 and the insulating layer 72 is reversed. In still another alternative embodiment, each of the insulating layer 42 and the insulating layer 72 have a first strain immediately after deposition and are subsequently treated to have a second strain, different than the first strain. Such a treatment can be before or after forming the composite layer 82 and can increase or decrease the magnitude of the strain in the treated portion of the composite layer 84.

In still another alternative embodiment, some or all of the first portions 421 can be merged such that the first portion 421 can include a single discrete element. Also, the second portion 422 and the second portion 721 can include a plurality of features.

Although the first portions 421, the second portion 422 and the third portion 721 of the composite layer 82 are illustrated in a top view using substantially rectangular feature shapes, this was done for simplicity of understanding and not intended to be limiting. Substantially any closed form shape can be used to form portions of the composite layer 82. Other shapes are possible such as, from a top view, triangular shapes, hexagonal shapes, the like, or any combination thereof can be used. Irregular shapes, curved shapes, such as circular shapes, oval shapes, or any combination thereof can also be used.

Also, the specific rules defining the exclusion region 32 can be more complex than described above. For example, the exclusion region 32 can be extended to include a dummy structure that otherwise would lie only partially within the exclusion region 32. Alternatively, the exclusion region can be reduced to exclude such dummy structures. In another embodiment, from a top view, the edge of the exclusion region 32 closest to the active region 28 is approximately line-on-line with the edge of the active region 28.

Many different aspects and embodiments are possible. Some of those aspects and embodiments are described below. After reading this specification, skilled artisans will appreciate that those aspects and embodiments are only illustrative and do not limit the scope of the present invention.

In a first aspect, an electronic device can include a field isolation region. The electronic device can also include a first insulating layer having a first strain and including a first portion overlying the field isolation region, wherein, from a top view, the first portion lies entirely within the field isolation region. The electronic device can further include a second insulating layer having a second strain different from the first strain and including an opening wherein, from a top view, the first portion of the first insulating layer lies within the opening in the second insulating layer.

In one embodiment of the first aspect, the first insulating layer and the second insulating layer include a nitride or an oxynitride. In another embodiment, the field isolation region includes an insulating region and a dummy structure. Also, the first insulating layer has a first edge, the second insulating layer has a second edge, and from a top view, the first edge and the second edge lie within the insulating region.

In a particular embodiment of the first aspect, the electronic device can further include a first active region lying immediately adjacent to the field isolation region, and including a p-channel transistor, wherein a second portion of the first insulating layer overlies the p-channel transistor. The electronic device can also include a second active region lying immediately adjacent to the field isolation region, and including an n-channel transistor, wherein the second insulating layer overlies the n-channel transistor. In a more particular embodiment, the first insulating layer has a compressive strain, and the second insulating layer has a tensile strain. In another more particular embodiment, from a top view, a shortest distance from the first portion of the first insulating layer to the second portion of the first insulating layer is at least approximately 2 microns.

In another embodiment of the first aspect, a quotient of a first area of the first insulating layer divided by a second area of the second insulating layer is greater than approximately 0.2.

In a second aspect, an electronic device can include a substrate and an active region. The electronic device can also include a field isolation region overlying the substrate and adjacent to the active region, wherein the field isolation region includes a first dummy structure including a first portion of the substrate, and a second dummy structure including a second portion of the substrate. The electronic device can further include a first insulating layer overlying the first dummy structure and not the second dummy structure, wherein the first insulating layer has a first strain. The electronic device can still further include a second insulating layer overlying the second dummy structure and not the first dummy structure, wherein the second insulating layer has a second strain different from the first strain. Also, from a top view, the first insulating layer lies within an opening in the second insulating layer, and substantially none of the active region lies within the opening.

In a particular embodiment of the second aspect, the first insulating layer overlies the active region, and the active region includes a p-channel transistor. In a more particular embodiment, a shortest distance from the first dummy structure to the active region is longer than a shortest distance from the second dummy structure to the active region. In another embodiment, from a top view, the first dummy structure lies within the opening in the second insulating layer.

In yet another embodiment of the second aspect, from a top view the field isolation region further includes an insulating region surrounding the first dummy structure and the second dummy structure. Also, the first insulating layer has a first edge, the second insulating layer has a second edge, and the first edge and the second edge overlie the insulating region. In still another embodiment, the first insulating layer and the second insulating layer have a substantially same chemical composition.

In a third aspect, a process of forming an electronic device can include forming a field isolation region within a substrate. The process can also include forming a first insulating layer over the field isolation region and having a first strain, wherein from a top view, an island portion of the first insulating layer lies entirely within the field isolation region. The process can further include forming a second insulating layer over the field isolation region, having a second strain different from the first strain, and including a first opening, wherein from a top view, the island portion of the first insulating layer lies within the first opening in the second insulating layer.

In one embodiment of the third aspect, forming the island portion includes forming the island portion more than approximately 2 microns from an active region including a p-channel transistor. In a particular embodiment, the first strain is a compressive strain, and the second strain is a tensile strain. In a more particular embodiment, forming the first insulating layer includes using a set of precursor chemicals, and forming the second insulating layer includes using a different set of precursor materials. In another more particular embodiment, forming the first insulating layer and forming the second insulating layer occur at different points in time.

In another particular embodiment of the third aspect, the process can further include forming a p-channel transistor prior to forming the first insulating layer, and forming an n-channel transistor prior to forming the second insulating layer. In a more particular embodiment, the process can further include forming a third insulating layer over the first insulating layer and the second insulating layer. The process can also include etching a first contact opening through the third insulating layer and stopping on the first insulating layer, and etching the first insulating layer within the first opening. The process can further include etching a second contact opening through the third insulating layer and stopping on the second insulating layer, and etching the second insulating layer within the second opening. The process can still further include forming a first contact within the first contact opening, wherein the first contact is electrically connected to the p-channel transistor, and forming the second contact within the second contact opening, wherein the second contact is electrically connected to the n-channel transistor.

Note that not all of the activities described above in the general description or the examples are required, that a portion of a specific activity may not be required, and that one or more further activities may be performed in addition to those described. Still further, the order in which activities are listed are not necessarily the order in which they are performed.

After reading this specification, skilled artisans will be capable of determining which one or more activities or one or more portions thereof are used or not used and the order of such activities are to be performed for their specific needs or desires.

Any one or more benefits, one or more other advantages, one or more solutions to one or more problems, or any combination thereof have been described above with regard to one or more specific embodiments. However, the benefit(s), advantage(s), solution(s) to problem(s), or any element(s) that may cause any benefit, advantage, or solution to occur or become more pronounced is not to be construed as a critical, required, or essential feature or element of any or all the claims.

The above-disclosed subject matter is to be considered illustrative, and not restrictive, and the appended claims are intended to cover all such modifications, enhancements, and other embodiments that fall within the scope of the present invention. Thus, to the maximum extent allowed by law, the scope of the present invention is to be determined by the broadest permissible interpretation of the following claims and their equivalents, and shall not be restricted or limited by the foregoing detailed description.

What is claimed is:

1. A process of forming an electronic device comprising:
    forming a field isolation region within a substrate to define a first active region and a second active region, wherein:
        the first active region lies immediately adjacent to the field isolation region; and
        the second active region lying immediately adjacent to the field isolation region and is spaced apart from the first active region;
    forming a p-channel transistor within the first active region;
    forming an n-channel transistor within the second active region;
    forming a first insulating layer over the field isolation region and having a first strain, wherein from a top view, an island portion of the first insulating layer lies entirely within the field isolation region, and wherein a second portion of the first insulating layer overlies the p-channel transistor; and
    forming a second insulating layer over the field isolation region, having a second strain different from the first strain, and including a first opening, wherein from a top view, the island portion of the first insulating layer lies within the first opening in the second insulating layer, and wherein the second insulating layer overlies the n-channel transistor.

2. The process of claim 1, wherein forming the island portion includes forming the island portion more than approximately 2 microns from the first active region.

3. The process of claim 1, wherein:
    the first strain is a compressive strain; and
    the second strain is a tensile strain.

4. The process of claim 3, wherein:
    forming the first insulating layer includes using a set of precursor chemicals; and
    forming the second insulating layer includes using a different set of precursor materials.

5. The process of claim 3, wherein forming the second insulating layer is performed at a particular radio frequency ("RF") and a particular RF power.

6. The process of claim 5, wherein forming the first insulating layer is performed at a different RF as compared to forming the second insulating layer or at a different RF power as compared to forming the second insulating layer.

7. The process of claim 3, wherein forming the first insulating layer and forming the second insulating layer occur at different points in time.

8. The process of claim 1, wherein:
forming the p-channel transistor is performed before forming the first insulating layer; and
forming the n-channel transistor is performed before forming the second insulating layer.

9. The process of claim 8, further comprising:
removing a portion of the first insulating layer from over the p-channel transistor; and
removing a portion of the second insulating layer from over the n-channel transistor.

10. The process of claim 8, further comprising:
forming a third insulating layer over the first insulating layer and the second insulating layer;
etching a first contact opening through the third insulating layer and stopping on the first insulating layer;
etching the first insulating layer within the first opening;
etching a second contact opening through the third insulating layer and stopping on the second insulating layer;
etching the second insulating layer within the second contact opening;
forming a first contact within the first contact opening, wherein the first contact is electrically connected to the p-channel transistor; and
forming a second contact within the second contact opening, wherein the second contact is electrically connected to the n-channel transistor.

11. A process of forming an electronic device comprising:
forming a field isolation region overlying a substrate to define an active region, wherein the field isolation region includes:
a first dummy structure including a first portion of the substrate; and
a second dummy structure including a second portion of the substrate;
forming a first insulating layer overlying the first dummy structure and not the second dummy structure, wherein the first insulating layer has a first strain; and
forming a second insulating layer overlying the second dummy structure and not the first dummy structure, wherein the second insulating layer has a second strain different from the first strain, and from a top view:
the first insulating layer lies within an opening in the second insulating layer; and
substantially none of the active region lies within the opening.

12. The process of claim 11, wherein forming the field isolation region is performed such that a shortest distance from the first dummy structure to the active region is longer than a shortest distance from the second dummy structure to the active region.

13. The process of claim 11, wherein forming the first insulating layer and forming the second insulating layer is performed such that the first insulating layer and the second insulating layer have a substantially same chemical composition.

14. The process of claim 11, wherein:
the first strain is a compressive strain; and
the second strain is a tensile strain.

15. The process of claim 14, wherein:
forming the first insulating layer includes using a set of precursor chemicals; and
forming the second insulating layer includes using a different set of precursor materials.

16. The process of claim 14, wherein forming the second insulating layer is performed at a particular radio frequency ("RF") and a particular RF power.

17. The process of claim 16, wherein forming the first insulating layer is performed at a different RF as compared to forming the second insulating layer or at a different RF power as compared to forming the second insulating layer.

18. The process of claim 14, wherein:
the process further comprises forming a p-channel transistor within the active region;
forming the field isolation defines another active region; and
the process further comprises forming an n-channel transistor within the other active region.

19. The process of claim 18, further comprising:
removing a portion of the first insulating layer from over the p-channel transistor; and
removing a portion of the second insulating layer from over the n-channel transistor.

20. The process of claim 19, further comprising removing another portion of the second insulating layer from over the first dummy structure.

* * * * *